US012641762B2

(12) United States Patent
Seo et al.

(10) Patent No.: US 12,641,762 B2
(45) Date of Patent: May 26, 2026

(54) DISPLAY DEVICE AND VEHICLE EQUIPPED WITH THE SAME

(71) Applicant: HYUNDAI MOBIS CO., LTD., Seoul (KR)

(72) Inventors: Jun Seong Seo, Yongin-si (KR); Joung Hoon Lee, Yongin-si (KR); In Whan Choi, Guri-si (KR); Gyeong Min Go, Hwaseong-si (KR); Byung Soo Kim, Hanam-si (KR); Hae Ri Kang, Suwon-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 239 days.

(21) Appl. No.: 18/519,753

(22) Filed: Nov. 27, 2023

(65) Prior Publication Data

US 2024/0397682 A1      Nov. 28, 2024

(30) Foreign Application Priority Data

May 26, 2023      (KR) ........................ 10-2023-0068364

(51) Int. Cl.
| | |
|---|---|
| *H05K 9/00* | (2006.01) |
| *B60K 35/00* | (2024.01) |
| *B60K 35/50* | (2024.01) |
| *H05K 5/02* | (2006.01) |

(52) U.S. Cl.
CPC ......... *H05K 9/0007* (2013.01); *H05K 5/0204* (2013.01); *B60K 35/00* (2013.01); *B60K 35/50* (2024.01); *B60K 2360/816* (2024.01)

(58) Field of Classification Search
None
See application file for complete search history.

(56) References Cited

U.S. PATENT DOCUMENTS

| | | | |
|---|---|---|---|
| 2003/0227581 A1 | 12/2003 | Sung et al. | |
| 2004/0202001 A1* | 10/2004 | Roberts ................... | B60Q 9/00 |
| | | | 362/494 |
| 2010/0165642 A1* | 7/2010 | Hsieh ..................... | H05K 7/142 |
| | | | 361/752 |
| 2012/0170223 A1* | 7/2012 | Yoon .................. | H05K 7/20963 |
| | | | 361/679.01 |
| 2013/0163214 A1 | 6/2013 | Lee et al. | |

(Continued)

OTHER PUBLICATIONS

European Search Report issued Aug. 5, 2024 in corresponding European Patent Application No. 23217830.1.

*Primary Examiner* — Allen L Parker
*Assistant Examiner* — Christopher L Augustin
(74) *Attorney, Agent, or Firm* — NovoTechIP International PLLC

(57) ABSTRACT

Disclosed is a display device mounted in a vehicle including a display panel, a fixing plate surrounding side surfaces and a rear surface of the display panel and having an opening defined therein, a printed circuit board connected to the display panel and located in the opening, and a back cover covering the fixing plate and the printed circuit board and made of a conductive material, wherein the back cover includes a first protrusion in contact with the printed circuit board. The display device reduces EMI noise caused by electromagnetic waves emitted between electronic components mounted on the printed circuit board via the back cover made of the conductive material.

10 Claims, 7 Drawing Sheets

(56)                  References Cited

U.S. PATENT DOCUMENTS

| | | | |
|---|---|---|---|
| 2014/0254192 A1* | 9/2014 | Do | ................... G02F 1/133308 |
| | | | 361/728 |
| 2017/0034960 A1 | 2/2017 | Ham et al. | |
| 2017/0358925 A1* | 12/2017 | Lopez | ................. B60H 1/0065 |
| 2019/0033651 A1* | 1/2019 | Lee | ................... G02F 1/133308 |
| 2021/0109396 A1* | 4/2021 | Lee | ....................... B60K 35/60 |
| 2024/0224446 A1* | 7/2024 | Kim | ................. G02F 1/133314 |

* cited by examiner (a)

(b)

DISPLAY DEVICE AND VEHICLE EQUIPPED WITH THE SAME

CROSS-REFERENCE TO RELATED APPLICATIONS

Pursuant to 35 U.S.C. § 119(a), this application claims the benefit of Korean Patent Application No. 10-2023-0068364, filed on May 26, 2023, which is hereby incorporated by reference as if fully set forth herein.

TECHNICAL FIELD

The present disclosure relates to a display device and a vehicle equipped with the same that may reduce EMI noise and secure rigidity while reducing a thickness of the display device via a back cover made of a conductive and high-strength composite material.

BACKGROUND

A center fascia display of a vehicle may display various visual information about the vehicle. Such a display device may also be installed on a dashboard of a vehicle disposed in front of a driver's seat and a front passenger seat, and provides various convenience information such as navigation, vehicle management and operation, Internet, and entertainment.

A display device processes a signal via a printed circuit board (PCB) located on a rear surface of a display panel to display an image.

Generally, an electronic device emits electromagnetic waves between electronic components mounted on the printed circuit board, causing an electromagnetic interference (EMI). The EMI causes malfunction of the electronic device or has a negative impact on a human body. In particular, as an operating frequency of the electronic device increases to be within a range of tens of Mhz to several Ghz, the EMI problems are becoming more serious.

EMI noise refers to noise that causes noise problems resulted from the interference when the electromagnetic wave generated from one electronic circuit, element, or component is transmitted to another circuit, element, or component.

Therefore, even a display device mounted in a vehicle requires means to solve the above-mentioned EMI noise problems.

In addition, the display device mounted in the vehicle has recently become larger in size, and accordingly, there is a need for means to reduce a thickness of the display device while simultaneously securing rigidity thereof.

SUMMARY

The present disclosure provides a display device and a vehicle equipped with the same. More specifically, the present disclosure is to provide a display device and a vehicle equipped with the same that may reduce EMI noise caused by electromagnetic waves emitted between electronic components mounted on a printed circuit board via a back cover made of a conductive material.

In addition, the present disclosure is to provide a display device and a vehicle equipped with the same that may secure rigidity while reducing a thickness compared to that of an existing display device via a back cover containing a high-strength composite material.

Problems to be solved in the present disclosure are not limited to the problems mentioned above, and other problems not mentioned will be clearly understood by those skilled in the art to which the present disclosure belongs from a description below.

Provided is a display device mounted in a vehicle including a display panel, a fixing plate surrounding side surfaces and a rear surface of the display panel and having an opening defined therein, a printed circuit board connected to the display panel and located in the opening, and a back cover covering the fixing plate and the printed circuit board and made of a conductive material, wherein the back cover includes a first protrusion in contact with the printed circuit board.

The first protrusion may provide a ground voltage of the printed circuit board to the back cover.

The back cover may include a second protrusion inserted into the fixing plate and spaced apart from the display panel.

The first protrusion may include a plurality of first protrusions formed to be spaced apart from each other along a perimeter of the printed circuit board, and the second protrusion may include a plurality of second protrusions formed to be spaced apart from each other along a perimeter of the fixing plate.

The display device may further include a conductive member that shields electromagnetic waves between the printed circuit board and the back cover.

The fixing plate may include ribs protruding toward the back cover at both sides of a rear surface thereof, and the back cover may include coupling grooves receiving the ribs inserted thereinto, respectively.

The back cover may contain a high-strength composite material, and the back cover may include a plurality of hooking protrusions formed on a rear surface thereof.

Provided is a vehicle including a vehicle body, a mounting portion located in the vehicle body, and a display device mounted on the mounting portion, wherein the display device includes a display panel, a fixing plate surrounding side surfaces and a rear surface of the display panel and having an opening defined therein, a printed circuit board connected to the display panel and located in the opening, and a back cover covering the fixing plate and the printed circuit board and made of a conductive material, wherein the back cover includes a first protrusion in contact with the printed circuit board.

The first protrusion may provide a ground voltage of the printed circuit board to the back cover.

The back cover may include a second protrusion inserted into the fixing plate and spaced apart from the display panel.

The display device and the vehicle equipped with the same according to the present disclosure may reduce the EMI noise caused by the electromagnetic waves emitted between the electronic components mounted on the printed circuit board via the back cover made of the conductive material.

In addition, the rigidity may be secured while reducing the thickness compared to that of the existing display device via the back cover containing the high-strength composite material.

Effects obtainable from the present disclosure are not limited to the effects mentioned above, and other effects not mentioned will be clearly understood by those skilled in the art to which the present disclosure belongs from a description below.

DETAILED DESCRIPTION

Description will now be given in detail according to exemplary embodiments disclosed herein, with reference to the accompanying drawings. The same or equivalent components may be provided with the same reference numbers, and description thereof will not be repeated. As used herein, the suffixes "module" and "part" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification. As such, the present disclosure should be construed to extend to any alterations, equivalents and substitutes in addition to those which are particularly set out in the accompanying drawings.

Although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, it will be understood that when an element is referred to as being "directly connected with" another element, there are no intervening elements present.

A singular representation may include a plural representation unless it represents a definitely different meaning from the context.

The terms such as "include" or "have" used herein are intended to indicate that features, numbers, steps, operations, elements, components, or combinations thereof used in the following description exist and it should be thus understood that the possibility of existence or addition of one or more different features, numbers, steps, operations, elements, components, or combinations thereof is not excluded.

Figure 1:
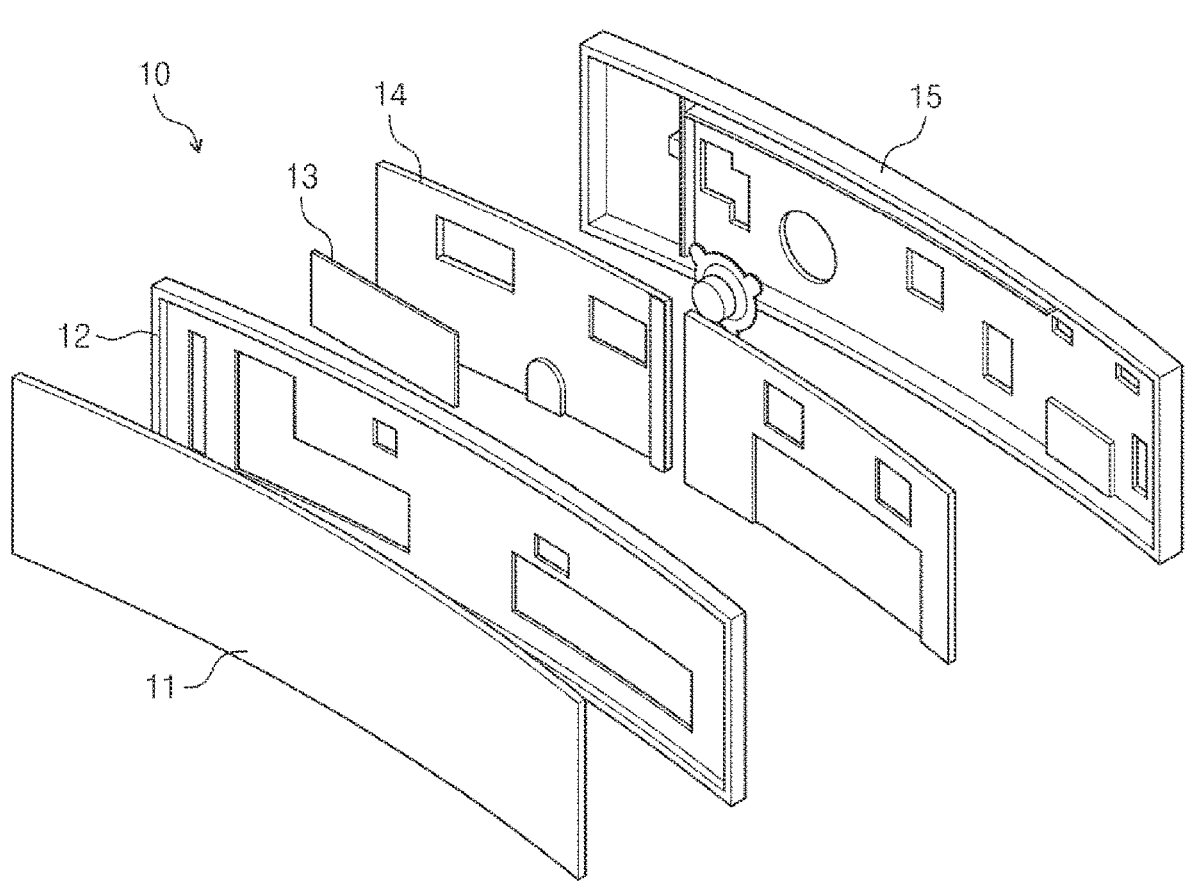
FIG. 1 is an exploded perspective view of a display device that is generally mounted in a vehicle.

FIG. 1 is an exploded perspective view of a display device 10 that is generally mounted in a vehicle.

As shown in FIG. 1, a general display device 10 includes a display panel 11, a panel member 12 surrounding side and rear surfaces of the display panel 11, a printed circuit board 13 connected to the display panel 11, a fixing bracket 14 where the printed circuit board 13 is mounted and for mounting the display device 10 to a vehicle, and a back cover 15. In this regard, the fixing bracket 14 maintains a rigidity of the display device 10 mounted in the vehicle, is for shielding and heat dissipation, and is generally made of aluminum. The back cover 15 is generally made of plastic.

Such general display device 10 is fixed to the vehicle via the fixing bracket 14 rather than the back cover 15. Therefore, when an occupant applies an external force to the display device 10, the external force applied to remaining components except the fixing bracket 14 may damage the display device 10. For example, when the occupant stands up while gripping the display device 10 or pulls the display device 10, the remaining components except the fixing bracket 14 fixed to the vehicle may move accordingly, causing the damage to the display device 10.

In addition, as described above, the display device 10 processes a signal via the printed circuit board 13 to display an image. An electronic device emits electromagnetic waves between electronic components mounted on the printed circuit board 13, causing an electromagnetic interference (EMI). The EMI causes malfunction of the electronic device or has a negative impact on a human body. In particular, as an operating frequency of the electronic device increases to be within a range of tens of Mhz to several Ghz, the EMI problems are becoming more serious.

EMI noise refers to noise that causes noise problems resulted from the interference when the electromagnetic wave generated from one electronic circuit, element, or component is transmitted to another circuit, element, or component.

Accordingly, the EMI noise generated by the electronic component mounted on the printed circuit board 13, which is mounted on the aluminum fixing bracket 14, may be transmitted directly to the display panel 11, causing a failure of the display device 10.

In addition, the display device 10 including the fixing bracket 14 is disadvantageous in terms of slimness. Because the display device 10 mounted in the vehicle has recently become larger, the display device 10 including the fixing bracket 14 is disadvantageous in terms of thickness, rigidity, and weight.

Figure 2:
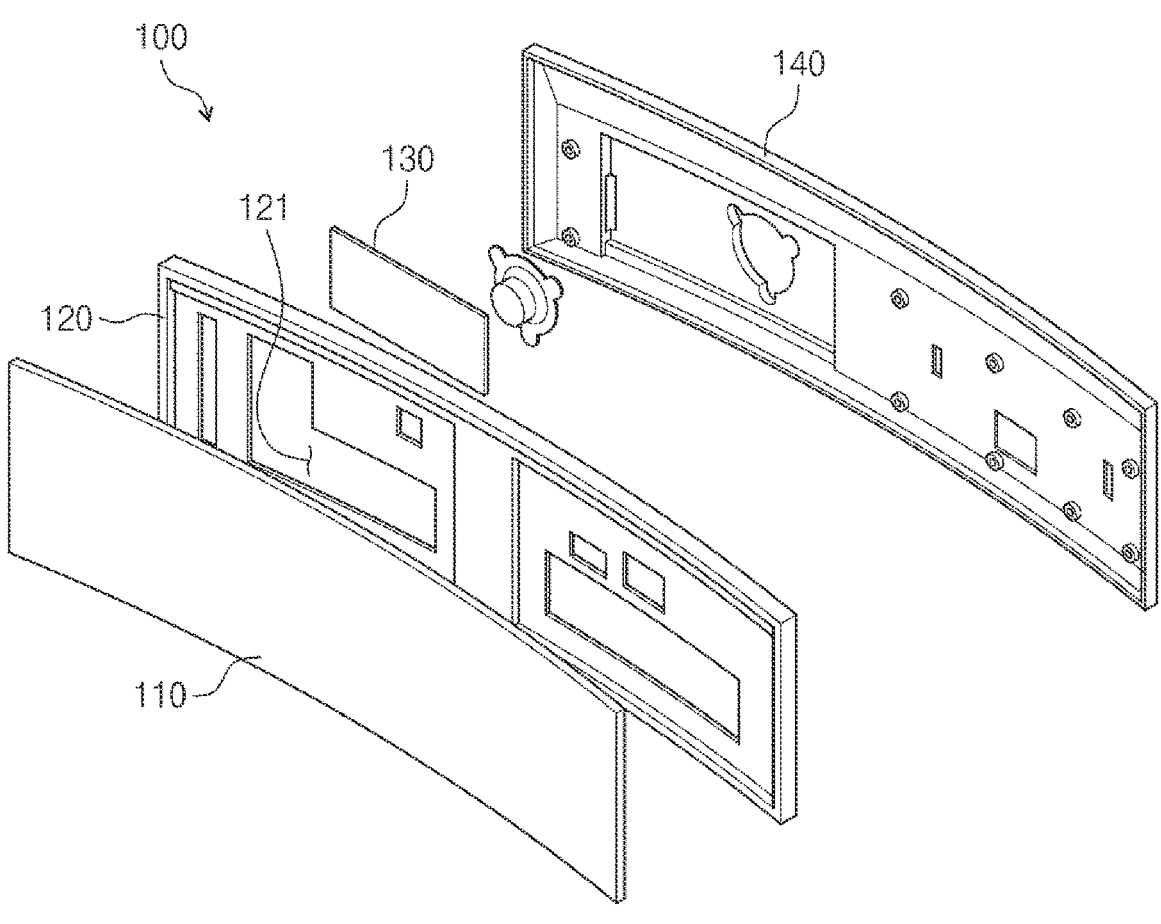
FIG. 2 is an exploded perspective view of a display device according to an embodiment of the present disclosure.

FIG. 2 is an exploded perspective view of a display device 100 according to an embodiment of the present disclosure.

The display device 100 according to one embodiment of the present disclosure may include a display panel 110, a fixing plate 120, a printed circuit board 130, and a back cover 140. In this regard, the fixing plate 120 may surround side and rear surfaces of the display panel 110 and may have an opening 121 defined therein. In addition, the printed circuit board 130 may be connected to the display panel 110 and positioned in the opening 121. Additionally, the back cover 140 may cover the fixing plate 120 and the printed circuit board 130 and may contain a conductive material.

That is, unlike the general display device 10 described above with reference to FIG. 1, the display device 100 according to one embodiment of the present disclosure may omit the fixing bracket 14, and the back cover 140 may contain the conductive material rather than the plastic. Accordingly, the EMI noise caused by the electromagnetic waves emitted between the electronic components mounted on the printed circuit board 130 may be reduced, and the thickness may also be reduced compared to that of the existing display device 10. Hereinafter, the display device 100 of the present disclosure will be described in more detail.

Figure 3:
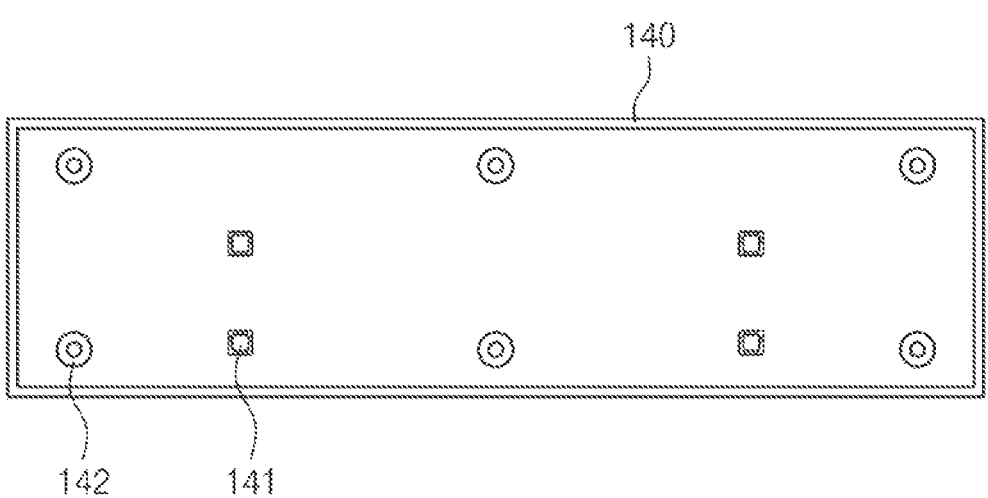
FIG. 3 is a front view of a back cover of a display device according to an embodiment of the present disclosure.
Figure 4:
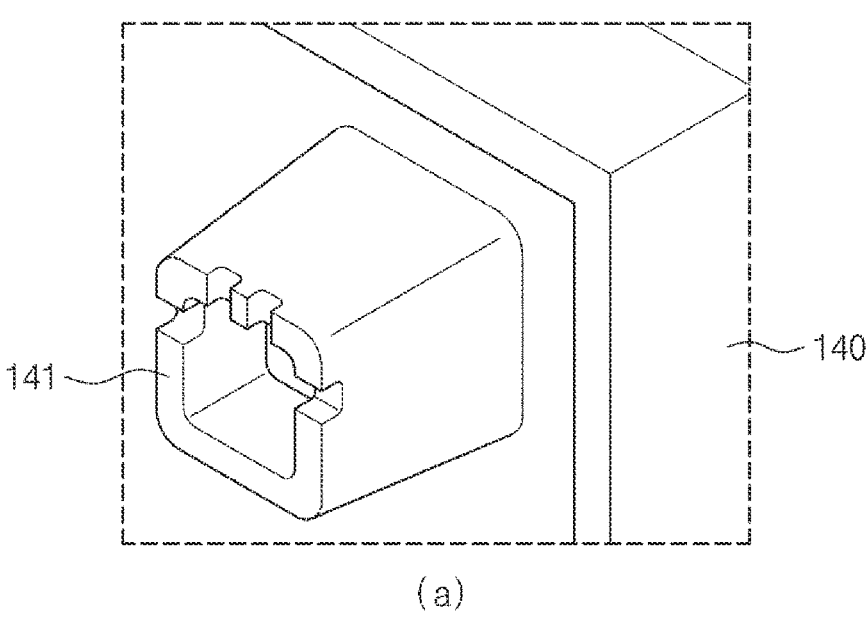
FIG. 4 is a view illustrating a first protrusion in a display device according to an embodiment of the present disclosure.
Figure 4:
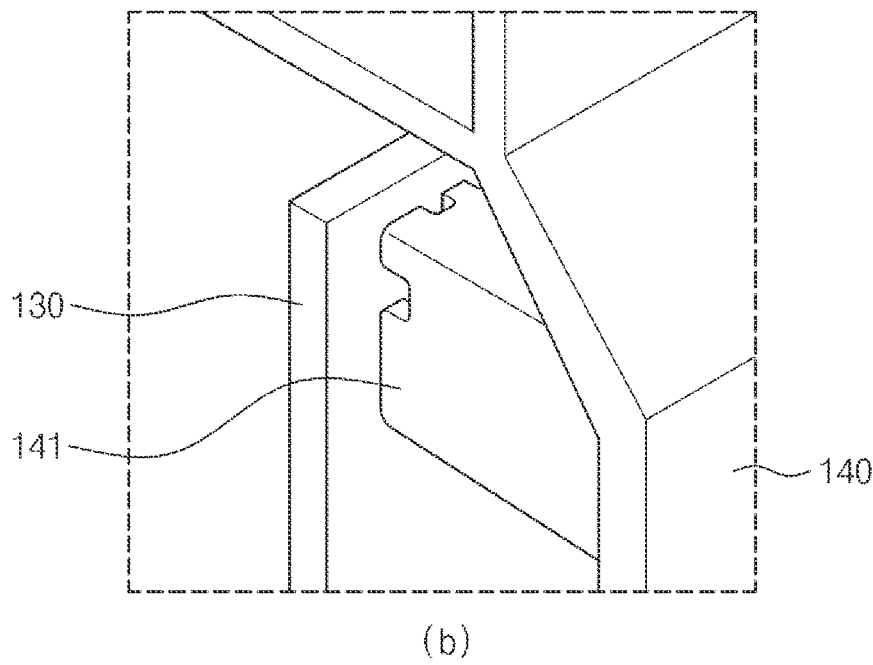
Figure 5:
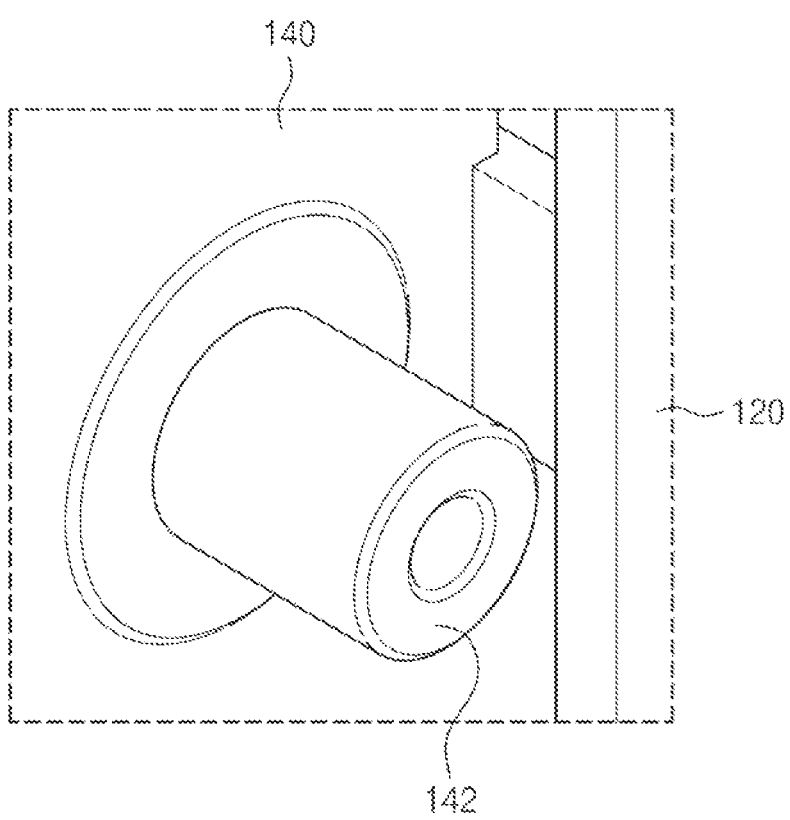
FIG. 5 is a diagram illustrating a second protrusion in a display device according to an embodiment of the present disclosure.
Figure 6:
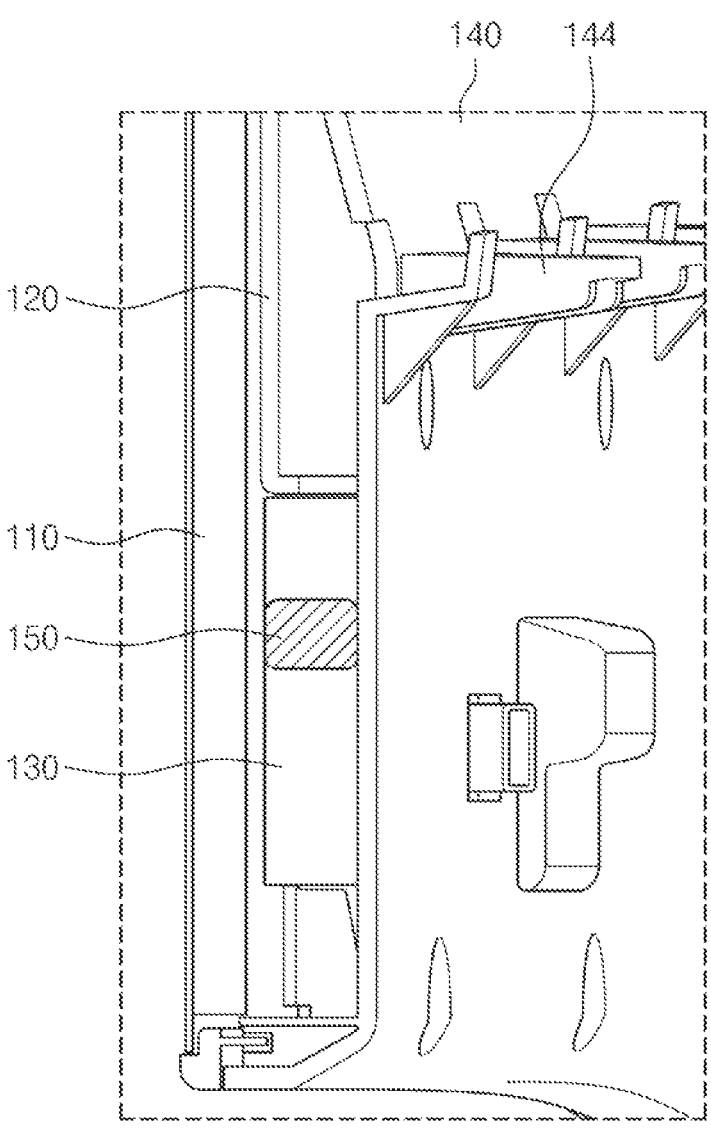
FIG. 6 is a diagram illustrating another embodiment of shielding electromagnetic waves via a display device of the present disclosure.
Figure 7:
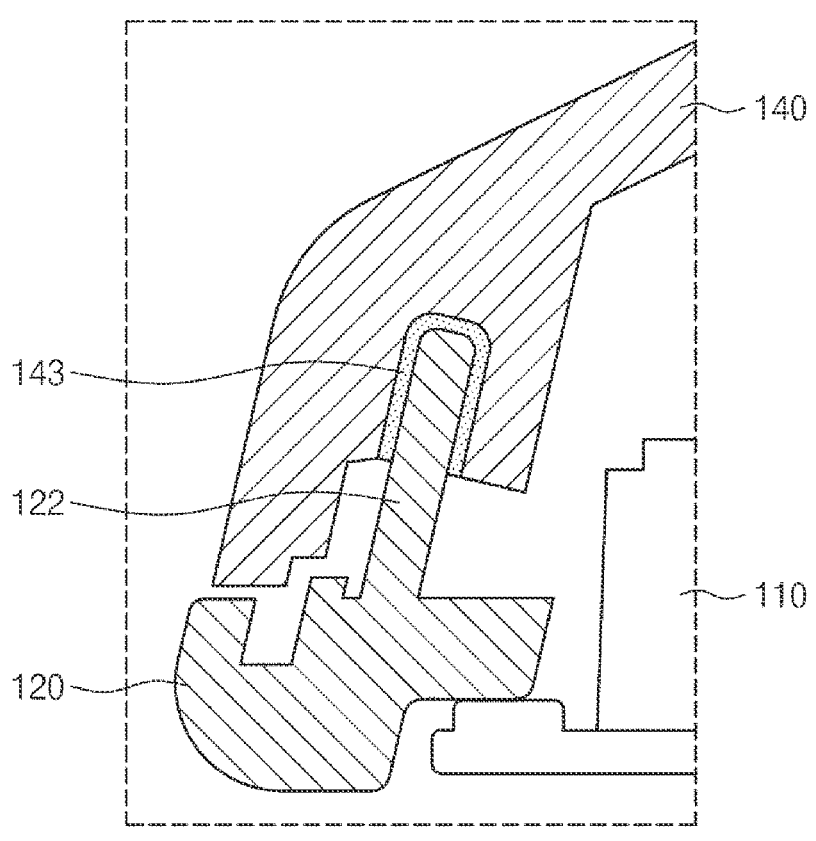
FIG. 7 is a diagram showing a coupling structure of a fixing plate and a back cover in a display device according to an embodiment of the present disclosure.

FIG. 3 is a front view of the back cover 140 of the display device 100 according to an embodiment of the present disclosure. FIG. 4 is a view illustrating a first protrusion 141 in the display device 100 according to an embodiment of the present disclosure. FIG. 5 is a diagram illustrating a second protrusion 142 in the display device 100 according to an embodiment of the present disclosure. FIG. 6 is a diagram illustrating another embodiment of shielding electromagnetic waves via the display device 100 of the present disclosure. In addition, FIG. 7 is a diagram showing a coupling structure of the fixing plate 120 and the back cover 140 in the display device 100 according to an embodiment of the present disclosure.

Referring to FIGS. 3 and 4 together, the display device 100 according to one embodiment of the present disclosure may include the first protrusion 141 in contact with the printed circuit board 130. In this regard, the first protrusion 141 may be in contact with the printed circuit board 130 and serve to fix the printed circuit board 130 connected to the display panel 110. Additionally, the first protrusion 141 may be in contact with the printed circuit board 130 and provide a ground voltage of the printed circuit board 130 to the back cover 140.

That is, the first protrusion 141 may serve to fix the printed circuit board 130 connected to the display panel 110 in the display device 100 of the present disclosure from which the fixing bracket 14 in FIG. 1 is omitted, and at the same time, may be in contact with the printed circuit board 130 and provide the ground voltage of the printed circuit board 130 to the back cover 140, thereby expanding a ground area and reducing the EMI noise.

More specifically, (a) in FIG. 4 is a diagram showing a shape of the first protrusion 141, and (b) in FIG. 4 shows a shape of the first protrusion 141 in contact with the printed circuit board 130. As shown in (a) in FIG. 4, a lower side of the first protrusion 141 may have a planar shape to be in contact with the printed circuit board 130 and fix the printed circuit board 130, and may act as a barrier to prevent the EMI occurred from the printed circuit board 130 from spreading. Additionally, an upper side of the first protrusion 141 may have a curved shape to expand the ground area by providing the ground voltage of the printed circuit board 130 to the back cover 140.

Accordingly, as shown in (b) in FIG. 4, the first protrusion 141 may be in contact with the printed circuit board 130 and fix the printed circuit board 130 connected to the display panel 110, and at the same time, provide the ground voltage of the printed circuit board to the back cover 140, thereby expanding the ground area and reducing the EMI noise.

FIG. 5 is a diagram illustrating the second protrusion 142 in the display device 100 according to an embodiment of the present disclosure. In the present disclosure, the back cover 140 may include the second protrusion 142, and the second protrusion 142 may be inserted into and disposed at the fixing plate 120 and spaced apart from the display panel 110.

In other words, the second protrusion 142 may be inserted into and disposed at the fixing plate 120 to strengthen the coupling structure of the display device 100 in the present disclosure from which the fixing bracket 14 in FIG. 1 is omitted, and at the same time, may be spaced apart from the display panel 110 to prevent the damage to the display device 100 by the external force of the occupant as described above.

In addition, referring to FIGS. 3 to 5 together, in the display device 100 according to one embodiment of the present disclosure, the back cover 140 may include the first protrusion 141 and the second protrusion 142, and the first protrusion 141 may include a plurality of first protrusions spaced apart from each other along a perimeter of the printed circuit board 130. Additionally, the second protrusion 142 may include a plurality of second protrusions spaced apart from each other along a perimeter of the fixing plate 120. In other words, as the plurality of first protrusions 141 and the plurality of second protrusions 142 are formed, the coupling structure of the components of the display device 100 of the present disclosure may be strengthened, and the EMI noise may also be effectively reduced.

FIG. 6 is a diagram illustrating another embodiment of shielding the electromagnetic waves via the display device 100 of the present disclosure. The display device 100 according to one embodiment of the present disclosure may further include a conductive member 150 that shields the electromagnetic waves between the printed circuit board 130 and the back cover 140. Additionally, such conductive member 150 may shield the electromagnetic waves generated between the electronic components mounted on the printed circuit board 130, thereby reducing the EMI noise.

FIG. 7 is a diagram illustrating the coupling structure of the fixing plate 120 and the back cover 140 in the display device 100 according to an embodiment of the present disclosure. In the display device 100 according to one embodiment of the present disclosure, the fixing plate 120 may include ribs 122 that protrude toward the back cover 140 at both sides of a rear surface thereof. Additionally, the back cover 140 may include each coupling groove 143 into which each rib 122 is inserted.

In the case of the general display device 10 shown in FIG. 1, the panel member 12 and the back cover 15 generally include a hook-shaped locking member and are coupled to each other via the locking member. However, in this case, when the occupant applies the external force to the display panel 11 to manipulate the display device 10, light leakage may occur as a gap occurs between the display panel 11 and the panel member 12 because of weak support against the external force.

Therefore, in the display device 100 according to one embodiment of the present disclosure, as shown in FIG. 7, the rib 122 formed on the fixing plate 120 is inserted into and disposed at the coupling groove 143 of the back cover 140, so that the back cover 140 may stably support the display device 100 even when the occupant applies the external force to the display panel 110, and thus, solve the problems such as the light leakage described above.

Additionally, referring to FIG. 6, the back cover 140 in the display device 100 according to one embodiment of the present disclosure may contain a high-strength composite material. In addition, the back cover 140 may include a plurality of hooking protrusions 144 formed on the rear surface thereof.

This is because the display device 10 may be damaged by the external force applied to the remaining components except the fixing bracket 14 when the occupant applies the external force to the display device 10 as the general display device 10 shown in FIG. 1 is fixed to the vehicle via the fixing bracket 14.

On the other hand, because the display device 100 according to one embodiment of the present disclosure omits the fixing bracket 14 in FIG. 1 and has a structure in which the hooking protrusions 144 of the back cover 140 containing the high-strength composite material with rigidity greater than that of the plastic material are directly fixed to the vehicle, the problem of damage caused by the external force applied to the display device 100 described above may be solved.

In summary, the display device and the vehicle equipped with the same according to the present disclosure may reduce the EMI noise caused by the electromagnetic waves emitted between the electronic components mounted on the printed circuit board via the back cover made of the conductive material. In addition, the back cover containing the high-strength composite material may secure the rigidity while reducing the thickness compared to that of the existing display device.

The above detailed description is to be construed in all aspects as illustrative and not restrictive. The scope of the present disclosure should be determined by reasonable interpretation of the appended claims and all changes coming within the equivalency range of the present disclosure are intended to be embraced in the scope of the present disclosure.

What is claimed is:

1. A display device for a vehicle, comprising:
a display panel having a plurality of side surfaces and a rear surface;
a fixing plate disposed on the rear surface of the display panel, covering the plurality of side surfaces and the rear surface of the display panel and having an opening exposing a portion of the rear surface of the display panel;
a printed circuit board connected to the display panel and disposed at the opening; and
a back cover including a conductive material, disposed on a rear surface of the fixing plate and covering the fixing plate and the printed circuit board,
wherein the back cover includes a first protrusion in contact with the printed circuit board and is shaped to cover an entirety of the rear surface of the fixing plate.

2. The display device of claim 1, wherein the first protrusion provides a ground voltage of the printed circuit board to the back cover.

3. The display device of claim 1, wherein the back cover includes a second protrusion located at the fixing plate and spaced apart from the display panel.

4. The display device of claim 3, wherein:
the first protrusion includes a plurality of first protrusions disposed along a perimeter of the printed circuit board and spaced apart from each other, and
the second protrusion includes a plurality of second protrusions disposed along a perimeter of the fixing plate and spaced apart from each other.

5. The display device of claim 1, wherein:
the fixing plate includes a plurality of ribs protruding toward the back cover at both sides of a rear surface of the fixing plate, and
the back cover includes a plurality of coupling grooves at which the plurality of ribs are respectively disposed.

6. A vehicle comprising:
a vehicle body having a mounting portion; and
the display device of claim 1, mounted on the mounting portion.

7. The vehicle of claim 6, wherein the first protrusion of the back cover of the display device provides a ground voltage of the printed circuit board to the back cover.

8. The vehicle of claim 6, wherein the back cover of the display device includes a second protrusion disposed at the fixing plate and spaced apart from the display panel.

9. A display device for a vehicle, comprising:
a display panel having a plurality of side surfaces and a rear surface;
a fixing plate surrounding the plurality of side surfaces and the rear surface of the display panel and having an opening;
a printed circuit board connected to the display panel and disposed at the opening;
a back cover including a conductive material and covering the fixing plate and the printed circuit board, wherein the back cover includes a first protrusion in contact with the printed circuit board; and
a conductive member configured to shield electromagnetic waves between the printed circuit board and the back cover.

10. A display device for a vehicle, comprising:
a display panel having a plurality of side surfaces and a rear surface;
a fixing plate surrounding the plurality of side surfaces and the rear surface of the display panel and having an opening;
a printed circuit board connected to the display panel and disposed at the opening; and
a back cover including a conductive material and covering the fixing plate and the printed circuit board,
wherein the back cover includes a first protrusion in contact with the printed circuit board,
wherein the back cover contains a high-strength composite material, and
wherein the back cover includes a plurality of hooking protrusions disposed on a rear surface of the back cover.

* * * * *